US009991476B2

(12) United States Patent
Xu

(10) Patent No.: US 9,991,476 B2
(45) Date of Patent: Jun. 5, 2018

(54) METHOD FOR MANUFACTURING FLEXIBLE OLED DISPLAY COMPONENT

(71) Applicant: Shenzhen China Star Optoelectronics Technology Co., Ltd., Shenzhen, Guangdong (CN)

(72) Inventor: Chao Xu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 105 days.

(21) Appl. No.: 14/778,262

(22) PCT Filed: Jul. 17, 2015

(86) PCT No.: PCT/CN2015/084284
§ 371 (c)(1),
(2) Date: Dec. 30, 2015

(87) PCT Pub. No.: WO2017/000326
PCT Pub. Date: Jan. 5, 2017

(65) Prior Publication Data
US 2017/0317317 A1 Nov. 2, 2017

(30) Foreign Application Priority Data
Jul. 2, 2015 (CN) .......................... 2015 1 0383409

(51) Int. Cl.
*H01L 21/00* (2006.01)
*H01L 51/56* (2006.01)
(Continued)

(52) U.S. Cl.
CPC .......... *H01L 51/56* (2013.01); *H01L 51/0097* (2013.01); *H01L 21/02118* (2013.01);
(Continued)

(58) Field of Classification Search
CPC ................. H01L 51/56; H01L 51/0097; H01L 2251/5315; H01L 2251/5338; H01L 27/28; H01L 23/293; H01L 21/02365; H01L 27/32; H01L 21/02118; H01L 25/047; H01L 29/84; H01L 2251/533
(Continued)

(56) References Cited

U.S. PATENT DOCUMENTS 8,188,509 B2 * 5/2012 Lee ...................... H01L 51/5246
257/100
2010/0081355 A1 * 4/2010 Inoue ...................... H01J 9/241
445/24
(Continued)

*Primary Examiner* — Vu A Vu
(74) *Attorney, Agent, or Firm* — Kim Winston LLP

(57) ABSTRACT

Disclosed is a method for manufacturing a flexible organic light-emitting diode (OLED) display component which includes steps of: forming a ferromagnetic material layer on a surface of a flexible substrate; and abutting the ferromagnetic material layer against a flat bearing surface, and applying a magnetic pull force directing to the bearing surface on the ferromagnetic material layer. Drawn by the magnetic pull force, the ferromagnetic material layer abuts closely against the flat bearing surface, smoothing out the flexible substrate, and meanwhile fixing the flexible substrate on the bearing surface.

11 Claims, 2 Drawing Sheets

(51) Int. Cl.
| | |
|---|---|
| *H01L 51/00* | (2006.01) |
| *H01L 27/32* | (2006.01) |
| *H01L 27/28* | (2006.01) |
| *H01L 25/04* | (2014.01) |
| *H01L 29/84* | (2006.01) |
| *H01L 21/02* | (2006.01) |
| *H01L 23/29* | (2006.01) |

(52) U.S. Cl.
CPC ...... *H01L 21/02365* (2013.01); *H01L 23/293* (2013.01); *H01L 25/047* (2013.01); *H01L 27/28* (2013.01); *H01L 27/32* (2013.01); *H01L 29/84* (2013.01); *H01L 2251/5315* (2013.01); *H01L 2251/5338* (2013.01)

(58) Field of Classification Search
USPC .......................................................... 438/29
See application file for complete search history.

(56) References Cited

U.S. PATENT DOCUMENTS

| | | | | |
|---|---|---|---|---|
| 2013/0089954 A1* | 4/2013 | Ro | ........................ | H01L 51/003 438/113 |
| 2016/0078988 A1* | 3/2016 | Han | ...................... | H01F 7/0221 427/69 |

* cited by examiner

METHOD FOR MANUFACTURING FLEXIBLE OLED DISPLAY COMPONENT

CROSS REFERENCE TO RELATED APPLICATIONS

The present application claims the priority of Chinese patent application CN201510383409.0, entitled "Method for manufacturing flexible OLED display component" and filed on Jul. 2, 2015, the entirety of which is incorporated herein by reference.

TECHNICAL FIELD

The present disclosure relates to a method for manufacturing organic light-emitting diode (OLED) display component, and in particular, to a method for manufacturing flexible OLED display component.

TECHNICAL BACKGROUND

Organic light-emitting diode (OLED) display components possess excellent characteristics, such as self-luminescence, full-color display, high brightness, high contrast ratio, low voltage, low power consumption, light and thin structure, high luminous efficiency, quick response, wide viewing angle, monolithic structure, simple manufacturing process, low cost, etc.

Flexible OLED display components are an organic thin-film electro-fluorescence component with a flexible structure. A Flexible OLED display component comprises a flexible substrate and organic light-emitting diodes, the flexible substrate being a base, and the thin-film organic light-emitting diodes being provided on the flexible substrate.

In the process of manufacturing flexible OLED display components, since the flexible substrate bends easily, the flexible substrate has to be adhered to a flat glass substrate so as to be supported by the glass substrate. In this case, the flexible substrate can keep flat during the process of forming organic light-emitting diodes thereon.

However, after being manufactured, the flexible OLED display component has to be peeled off the glass substrate. Since the flexible substrate and the glass substrate are held together with super glue, it is very hard to peel the flexible OLED display component off the glass substrate. Besides, before peeling the flexible OLED display component off the glass substrate, the flexible OLED display component and the glass substrate have to be cut simultaneously so that the flexible OLED display component can have a predetermined size. Thus, a glass substrate is consumed each time a flexible OLED display component is manufactured.

SUMMARY OF THE INVENTION

The objective of the present disclosure is to solve the technical problem that in the process of manufacturing a flexible organic light-emitting diode (OLED) display components, it is hard to keep the flexible substrate fixed and flat.

Directed by the above technical problem, the present disclosure provides a method for manufacturing flexible OLED display component, which comprises steps of: forming a ferromagnetic material layer on a surface of a flexible substrate; and abutting the ferromagnetic material layer against a flat bearing surface, and applying a magnetic pull force directing to the bearing surface on the ferromagnetic material layer.

In one embodiment, the bearing surface is provided with a magnet on a surface thereof opposite to the ferromagnetic material layer, so that the magnetic pull force can be exerted on the ferromagnetic material layer by the magnet.

In one embodiment, the magnet is an electromagnet.

In one embodiment, the bearing surface is a surface of a cooling plate of a vacuum evaporator.

In one embodiment, the ferromagnetic material layer has an even thickness.

In one embodiment, the magnetic pull force is evenly distributed on the ferromagnetic material layer.

In one embodiment, the magnetic pull force is perpendicular to the bearing surface.

In one embodiment, the method further comprises forming organic light-emitting diodes on the other surface of the flexible substrate.

In one embodiment, the flexible OLED display component is a bottom-emitting flexible OLED display component, and after all the organic light-emitting diodes are formed, the ferromagnetic material layer is removed.

In one embodiment, the flexible OLED display component is a top-emitting flexible OLED display component.

The ferromagnetic material layer interacts with the magnetic field, so that it is acted thereupon by a magnetic pull force directing to the bearing surface, in which case, the ferromagnetic material layer is attracted onto the bearing surface. When the ferromagnetic material layer abuts against the flat bearing surface, the flexible substrate is smoothed out. In addition, since the ferromagnetic material layer abuts against the flat bearing surface, the positions of the two are relatively fixed, thereby fixing the flexible substrate on the bearing surface. Furthermore, since magnitude of the magnetic pull force can be easily controlled, it will be easy to remove the flexible substrate from the bearing surface.

BRIEF DESCRIPTION OF THE DRAWINGS

A more detailed description on the present disclosure will be given below based on the embodiments and with reference to the accompanying drawings.

In the accompanying drawings, the same components are indicated by the same reference signs, and the drawings are not drawn to scale.

DETAILED DESCRIPTION OF THE EMBODIMENTS

The present disclosure will be explained further in detail with reference to the accompanying drawings.

Figure 1:
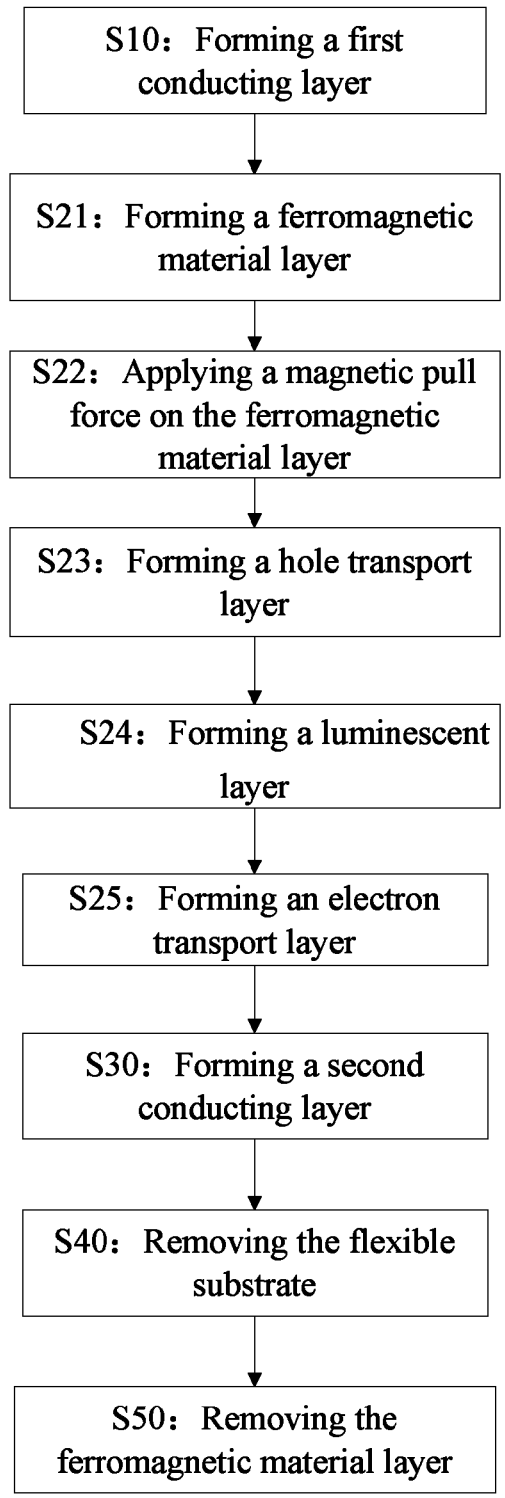
FIG. 1 shows a flow chart of a method for manufacturing flexible OLED display component according to an embodiment of the present disclosure.

As shown in FIG. 1, the present embodiment introduces a method for manufacturing a flexible organic light-emitting diode (OLED) display component 100, which comprises the following steps.

In step S10, a first conducting layer is formed on a surface, namely a first surface, of the flexible substrate 1. The first conducting layer is patterned to form a plurality of parallel anode lines 31.

The flexible substrate 1 can be a resin substrate. The first conducting layer is usually formed on the first surface of the flexible substrate 1 by a physical vapor deposition method which can be, for example, sputter deposition, or vacuum evaporation. The first conducting layer is usually made of a transparent conducting material, and can be, for example, an indium tin oxide film. The first conducting layer can be photoetched to form a plurality of anode lines 31 that are parallel to each other. Two neighboring anode lines 31 are spaced from each other. The first conducting layer usually serves as an anode of the organic light-emitting diode.

Preferably, after the first conducting layer is formed, a surface of the first conducting layer opposite to the flexible substrate 1 is treated, so as to improve performance function of the first conduction layer, thereby decreasing the hole injection barrier. The surface treatment method can be, for example, ultraviolet-ozone treatment, plasma treatment or the like. The surface treatment is able to reduce the surface roughness of the first conducting layer.

In step S20, an organic thin film is formed on the first conducting layer. In the present embodiment, the organic thin film is formed by evaporation method, which specifically comprises steps S21, S22, S23, S24, and S25.

In step S21, a ferromagnetic material layer 2 is formed on a second surface of the flexible substrate 1 (i.e., a surface opposite to the first surface) by, for example, physical vapor deposition method. The ferromagnetic material layer 2 is made of a material comprising ferromagnetic material which can be, for example, iron, cobalt, or nickel. The physical vapor deposition method can be, for example, sputter deposition, or vacuum evaporation. The ferromagnetic material layer 2 is very thin, and therefore has a very low strength, in which case, the flexible substrate 1 to which the ferromagnetic material layer 2 adheres also has a small change rate of strength. Preferably, the ferromagnetic material layer 2 has an even thickness. In addition, the ferromagnetic material layer 2 can also be formed on the second surface by coating.

In step S22, the flexible substrate 1 is spread smoothly on a flat bearing surface, the second surface of the flexible substrate 1 facing the bearing surface. A magnetic pull force directing to the bearing surface is exerted on the ferromagnetic material layer 2, so that the flexible substrate 1 is spread out flat and is fixed relative to the bearing surface. The bearing surface is usually a bearing surface of a loading table of processing equipment.

Figure 2:
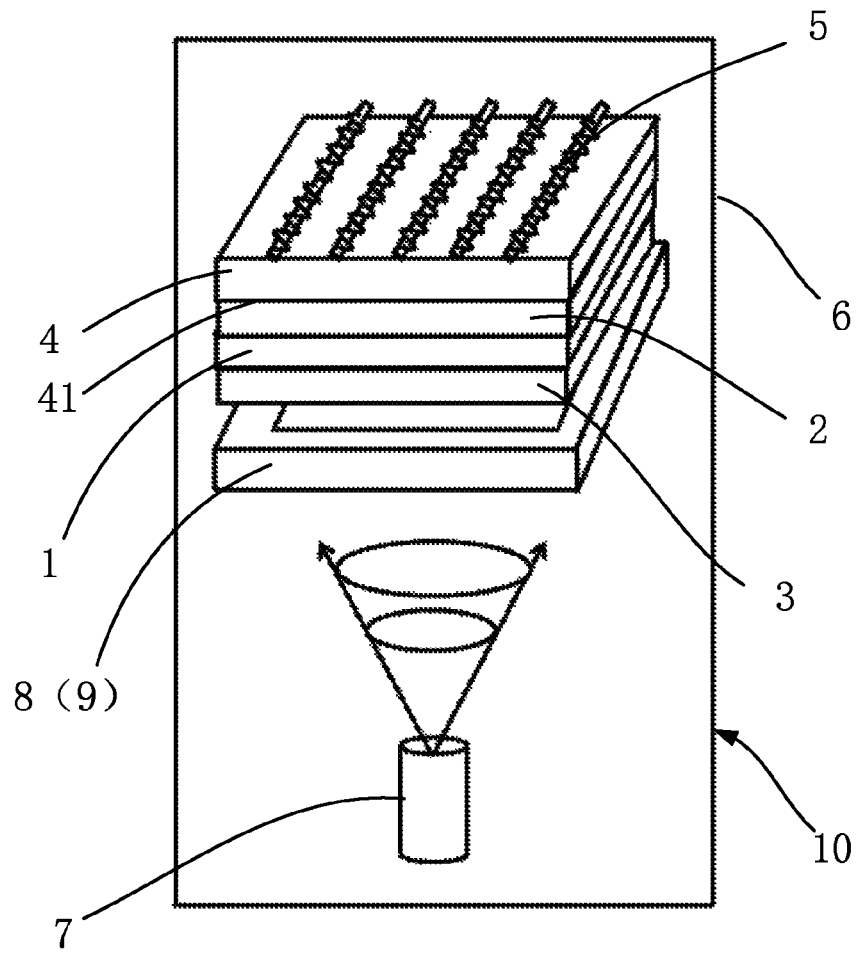
FIG. 2 schematically shows the structure of a vacuum evaporator according to an embodiment of the present disclosure.

As shown in FIG. 2, the vacuum evaporator 10 comprises a vacuum chamber 6 which is provided therein with a loading board 4, an electromagnet 5, and an evaporator source 7. The loading board 4 serves as a loading table of the vacuum evaporator 10, and is structured substantially to have a shape of a plate, and is disposed horizontally. A surface of the loading board 4 facing downward is the bearing surface 41. The electromagnet 5 is provided over the loading board 4. The evaporator source 7 is provided right under the loading board 4, with an opening thereof facing upward.

When the electromagnet 5 is activated, the flexible substrate 1 is spread out on the bearing surface 41, the second surface of the flexible substrate 1 facing upward. A magnetic pull force from the electromagnet 5 and directing to the loading board 4 is exerted on the ferromagnetic material layer, thereby fixing the flexible substrate 1 on the bearing surface 41 of the loading board 4. Since the bearing surface 41 is flat, the flexible substrate 1 is spread out flat on the bearing surface 41 when the ferromagnetic material layer and the bearing surface 41 stick to each other. Obviously, the electromagnet 5 herein can be substituted with a permanent magnet which is, preferably, magnetic steel.

Preferably, the electromagnet 5 is provided right above the ferromagnetic material layer 2, so that the magnetic pull force is directed as being perpendicular to the bearing surface 41, which enables the flexible substrate 1 to be fixed more firmly on the bearing surface 41.

Preferably, the loading board 4 is a cooling plate of the vacuum evaporator 10. The flexible substrate 1 transmits heat to the cooling plate, thereby preventing the flexible substrate 1 from expanding or becoming soft due to the heat generated during the evaporation.

Preferably, a plurality of the electromagnets 5 is provided, and is distributed evenly over the loading board 4. Therefore, the magnetic pull force acted upon the ferromagnetic material layer 2 can be evenly distributed on the ferromagnetic material layer 2, which enables the flexible substrate 1 to be spread out more flat.

In step S23, a hole transport layer is formed on the first conducting layer. The hole transport layer is patterned to form a plurality of hole transport blocks 32, which covers the plurality of anode lines 31 and is arranged in the form of an array.

In the present embodiment, a hole transport material is evaporated to form a hole transport layer on the first conducting layer. Specifically, a first evaporation mask 8 is provided between the first conducting layer and the evaporator source 7. The first evaporation mask 8 is provided thereon with meshes arranged in the form of a matrix. The meshes are aligned with the anode lines 31. After the hole transport material is put into the evaporator source 7, the vacuum chamber 6 is evacuated. Then, the evaporator source 7 is activated to heat the hole transport material, so that the hole transport material can be changed into gas. The gaseous hole transport material passes through the meshes of the first evaporation mask 8, and deposits on the anode lines 31, forming a plurality of hole transport blocks 32 on the plurality of anode lines 31. The plurality of hole transport blocks 32 is arranged in the form of a matrix. The hole transport material can be m-MTDATA.

In step S24, an luminescent layer is formed on the hole transport layer. The luminescent layer is patterned to form a plurality of luminescent blocks 33 which covers the hole transport blocks 32, each of the luminescent blocks 33 corresponding to a respective hole transport block 32.

In the present embodiment, a luminescent material is evaporated to form a luminescent layer on the hole transport layer. Specifically, a first evaporation mask 8 is provided between the hole transport layer and the evaporator source 7. The meshes of the first evaporation mask 8 are aligned with the hole transport blocks 32. After the organic luminescent material is put into the evaporator source 7, the vacuum chamber 6 is evacuated. Then, the evaporator source 7 is activated to heat the organic luminescent material, so that the organic luminescent material can be changed into gas. The gaseous organic luminescent material passes through the meshes of the first evaporation mask 8, and deposits on hole transport blocks 32, forming a plurality of luminescent blocks 33. Each of the luminescent blocks 33 covers a respective hole transport block 32. Thus, the plurality of luminescent blocks 33 is also arranged in the form of a matrix. The organic luminescent material can be an organometallic complex, which can be, for example, Alq3 or Gaq3.

In step S25, an electron transport layer is formed on the luminescent layer. The electron transport layer is patterned to form a plurality of electron transport blocks 34, which covers the luminescent blocks 33, each of the electron transport blocks 34 corresponding to a respective luminescent block 33.

In the present embodiment, an electron transport material is evaporated to form an electron transport layer on the luminescent layer. Specifically, a first evaporation mask 8 is provided between the luminescent layer and the evaporator source 7. The meshes of the first evaporation mask 8 are aligned with luminescent blocks 33. After the electron transport material is put into the evaporator source 7, the vacuum chamber 6 is evacuated. Then, the evaporator source 7 is activated to heat the electron transport material, so that the electron transport material can be changed into gas. The gaseous electron transport material passes through the meshes of the first evaporation mask 8, and deposits on the luminescent blocks 33, forming a plurality of electron transport blocks 34, which is also arranged in the form a matrix. The electron transport material can be 1, 3, 4-oxadiazole.

In step S30, a second conducting layer is formed on the electron transport layer. The second conducting layer is patterned to form a plurality of cathode lines 35, the cathode lines 35 being parallel to one another but perpendicular to the anode lines 31. Each of the cathode lines 35 covers a plurality of electron transport blocks 34. Two neighboring cathode lines 35 are spaced from each other.

A second evaporation mask 9 is provided between the electron transport layer and the evaporator source 7. A mask of cathode lines 35 is parallel to the flexible substrate 1. The mask of cathode lines 35 is provided thereon with meshes having the patterns of the cathode lines 35. After a metal material is put into the evaporator source 7, the vacuum chamber 6 is evacuated. Then, the evaporator source 7 is activated to heat the metal material, so that the metal material can be changed into gas. The metal material can be a magnesium-silver alloy. The gaseous metal material passes through the meshes of the second evaporation mask 9, and deposits on the electron transport layer, forming cathode lines 35 which are connected to a plurality of electron transport blocks 34.

Figure 3:
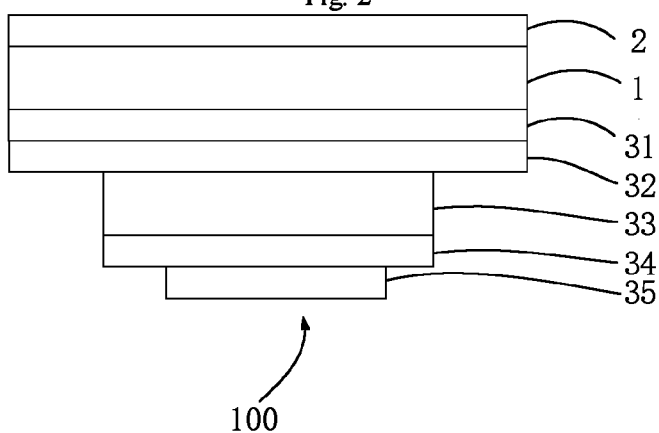
FIG. 3 schematically shows the structure of a flexible OLED display component according to an embodiment of the present disclosure.

When step S30 is completed, a plurality of organic light-emitting diodes 3 arranged in the form of a matrix is formed on the first surface of the flexible substrate 1. As shown in FIG. 3, each of the organic light-emitting diodes 3 includes an anode line 31, a hole transport block 32, a luminescent block 33, an electron transport block 34, and a cathode line 35, which are stacked in order.

In step S40, the flexible substrate 1 is removed from the bearing surface 41.

The ferromagnetic material layer attaches to the bearing surface 41 under the influence of the magnetic pull force. Therefore, the flexible substrate 1 can be easily removed from the bearing surface 41 by operator. If the magnetic pull force is generated by interaction between the ferromagnetic material layer and the electromagnets 5, it can be eliminated by switching off the electromagnets 5 prior to step S40. Thus, it will be much easier to remove the flexible substrate 1 from the bearing surface 41. Of course, the magnetic pull force can also be decreased by enlarging the distance between the electromagnet and the ferromagnetic material layer 2.

In step S50, the ferromagnetic material layer 2 is removed.

The ferromagnetic material layer 2 can be removed through being corroded by an etching solution. The etching solution can be a strong acid such as diluted hydrochloric acid, or diluted sulphuric acid. The flexible OLED display component 100 can be a bottom-emitting flexible OLED display component. Therefore, when the light emitted by the organic light-emitting diodes 3 has to exit by passing through the flexible substrate, the ferromagnetic material layer 2 should be removed.

In a preferred embodiment, the flexible OLED display component 100 is a top-emitting flexible OLED display component. The direction of the light emitted by the top-emitting flexible OLED display component is opposite to the ferromagnetic material layer 2. In this case, step S50 can be omitted when a top-emitting flexible OLED display component is manufactured. Therefore, the method is particularly suitable for manufacturing a top-emitting flexible OLED display component.

In a preferred embodiment, step S21 is first performed to form a ferromagnetic material layer 2 on a surface of the flexible substrate 1, and then step S10 is performed to form a first conducting layer on the other surface of the flexible substrate 1.

When step S10 is performed, the flexible substrate 1 is spread out flat on the flat bearing surface by using the magnetic pull force, the ferromagnetic material layer 2 abutting against the bearing surface. Then, a first conducting layer is formed on a surface of the flexible substrate 1 opposite to the ferromagnetic material layer 2 by means of sputter deposition, or vacuum evaporation.

In a preferred embodiment, steps S23, S24, S25, and S30 can be performed on different equipment, which can be several vacuum evaporators 10, so that layers formed in subsequent steps will not be polluted by the remnant of the formed layers left in the equipment from a previous step.

Since steps S23, S24, S25, and S30 are performed on different equipment, when these steps are performed in sequence, steps S40 and S22 are performed repeatedly between two neighboring steps among S23, S24, S25, and S30. In this case, the flexible substrate 1 can be taken off from one piece of equipment and then be fixed on another piece of equipment. This process is simple and easy to operate.

The above details are only descriptions on preferred embodiments of the present disclosure. Any improvements on the implementing forms or substitutions of the components thereof with equivalents can be made or done without departing from the scope of the present disclosure. It should be noted that as long as there is no structural conflict, any of the embodiments and any of the technical features thereof may be combined with one another. The present disclosure is not limited to any disclosed embodiment, and comprises all technical solutions falling within the scope of the present disclosure.

The invention claimed is:

1. A method for manufacturing a flexible organic light-emitting diode (OLED) display component, comprising steps of:
    forming a ferromagnetic material layer on a surface of a flexible substrate,
    abutting the ferromagnetic material layer against a flat bearing surface, and applying a magnetic pull force directing to the bearing surface on the ferromagnetic material layer,
    forming organic light-emitting diodes on the other surface of the flexible substrate, and
    removing the ferromagnetic material layer after all the organic light-emitting diodes are formed,
    wherein the flexible OLED display component is a bottom-emitting flexible OLED display component.

2. The method according to claim 1, wherein the bearing surface is provided with a magnet on a surface thereof opposite to the ferromagnetic material layer, so that the magnetic pull force is exerted on the ferromagnetic material layer by the magnet.

3. The method according to claim 2, wherein the magnet is an electromagnet.

4. The method according to claim 1, wherein the bearing surface is a surface of a cooling plate of a vacuum evaporator.

5. The method according to claim 1, wherein the ferromagnetic material layer has an even thickness.

6. The method according to claim 1, wherein the magnetic pull force is evenly distributed on the ferromagnetic material layer.

7. The method according to claim 2, wherein the magnetic pull force is evenly distributed on the ferromagnetic material layer.

8. The method according to claim 3, wherein the magnetic pull force is evenly distributed on the ferromagnetic material layer.

9. The method according to claim 1, wherein the magnetic pull force is perpendicular to the bearing surface.

10. The method according to claim 2, wherein the magnetic pull force is perpendicular to the bearing surface.

11. The method according to claim 3, wherein the magnetic pull force is perpendicular to the bearing surface.

* * * * *